United States Patent

Mochida et al.

[11] Patent Number: 5,287,064
[45] Date of Patent: Feb. 15, 1994

[54] BONDING POINT POLARITY DETERMINING APPARATUS

[75] Inventors: Tooru Mochida; Yoshimitsu Terakado, both of Tokyo, Japan

[73] Assignee: Kabushiki Kaisha Shinkawa, Tokyo, Japan

[21] Appl. No.: 887,067

[22] Filed: May 22, 1992

[30] Foreign Application Priority Data

May 24, 1991 [JP] Japan ................................. 3-148126

[51] Int. Cl.⁵ ............................................. G01R 19/00
[52] U.S. Cl. .................................. 324/606; 324/158 D; 324/133
[58] Field of Search ............... 324/606, 715, 718, 133, 324/555, 537, 158 R, 158 D

[56] References Cited

U.S. PATENT DOCUMENTS

| | | | |
|---|---|---|---|
| 3,617,879 | 11/1971 | Mugnier | 324/133 |
| 3,975,683 | 8/1976 | Behrens et al. | 324/158 D |
| 4,346,347 | 8/1982 | Kamata et al. | 324/158 D |
| 4,779,041 | 10/1988 | Williamson, Jr. | 324/158 R |
| 4,779,043 | 10/1988 | Williamson, Jr. | 324/158 R |

FOREIGN PATENT DOCUMENTS

| | | | |
|---|---|---|---|
| 0056173 | 3/1984 | Japan | 324/133 |
| 0203966 | 11/1984 | Japan | 324/133 |
| 1-58868 | 12/1989 | Japan | H01L 21/66 |
| 388377 | 10/1973 | U.S.S.R. | 324/133 |

Primary Examiner—Michael J. Tokar
Assistant Examiner—Maura K. Regan
Attorney, Agent, or Firm—Koda and Androlia

[57] ABSTRACT

An apparatus for determining the polarities of bonding points to locate false bonding connections including an applied voltage output circuit which outputs positive and negative voltages, a switching circuit which after a wire is connected to a bonding point impresses voltage from the applied voltage output circuit to the bonding wire, a D/A converter which outputs standard positive and negative voltages, a polarity determining comparator which determines the polarity of the bonding point by comparing the voltage detected on the bonding wire with the standard voltage, and a memory which stores such a determination result for each bonding point.

2 Claims, 2 Drawing Sheets

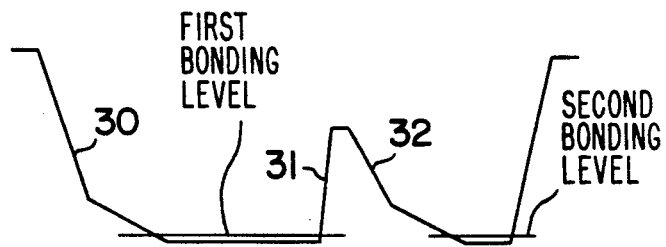
FIG. 2(a) VERTICAL PATH OF BONDING TOOL
FIG. 2(b) ULTRASONIC GENERATION
FIG. 2(c) DETECTION TIMING
FIG. 2(d) GATE SIGNAL
FIG. 2(e) STANDARD THRESHOLD VOLTAGE
FIG. 2(f) APPLIED VOLTAGE
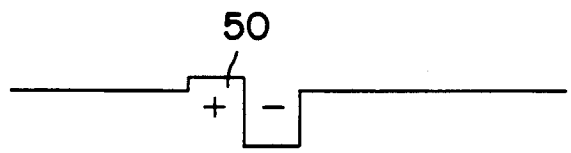
FIG. 2(g) POSITIVE POLARITY
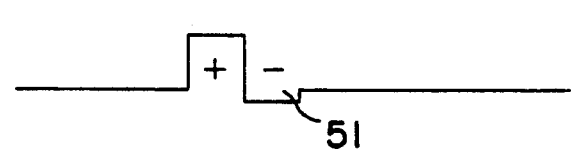
FIG. 2(h) NEGATIVE POLARITY
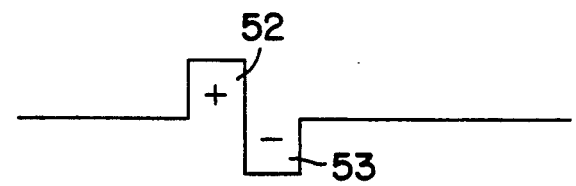
FIG. 2(i) POLARITY WITH NO DETECTION REQUIRED
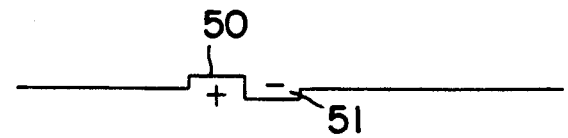
FIG. 2(j) NO POLARITY

BONDING POINT POLARITY DETERMINING APPARATUS

BACKGROUND OF THE INVENTION

1. Field of the Invention

This invention relates to an apparatus for determining the polarity of bonding points.

2. Prior Art

As a method to detect connection faults in wire bonding after the wire is connected to a first bonding point, Japanese Patent Application Publication No. 1-58868, for example, is known. In this prior art, when detecting the connection fault of the first bonding point, it is necessary to apply positive or negative voltage to the first bonding point, switching from one to the other, depending on the polarity of the first bonding point.

FIGS. 3(a) through 3(d) show the polarities of the first bonding point. In these Figures, reference numeral 1 represents a lead frame, 2 a chip bonded to the lead frame 1, and 3 a wire connected to an electrode (which is the first bonding point) of the chip 2. As shown in these Figures, there are various electrodes (first bonding points) which are different in polarities. Therefore, when detecting connection faults at the first bonding points, it is necessary to apply positive or negative voltage, switching from one to the other depending on the polarity.

FIG. 3(a) shows that the first bonding point sends the current forward (hereinafter referred to as having "positive polarity"), and detection is performed by applying positive voltage. In FIG. 3(b), the first bonding point sends the current backward (hereinafter referred to as having "negative polarity"); as a result, detection is performed by applying negative voltage.

In FIG. 3(c), the portion of the chip 2 corresponding to the first bonding point is of a non-conductive material (hereinafter referred to as having "polarity with no detection required"). Accordingly, no detection is possible regardless of whether a positive or negative voltage is applied, and therefore detection is not needed. In FIG. 3(d), a portion of the chip 2 that corresponds to the first bonding point has no polarity but has some resistance (hereinafter referred to having "no polarity"); accordingly, detection can be performed by applying either positive or negative voltage.

As described above, when detecting connection faults at the first bonding point, it is necessary to change the applied voltage depending on the polarity of the first bonding point. Accordingly, it is also necessary that the polarity of the first bonding point be checked beforehand so as to apply voltage that is suitable for such a checked first bonding point.

Currently, the determination of the polarity of the first bonding point is performed by an operator. The operator moves a probe so that it touches each bonding point to determine their polarities by applying positive and negative voltages and monitoring the polarity of the bonding point on a display.

In this conventional way, since an operator determines the polarity of each bonding point, it requires a great amount of time and effort, and it also involves the risk of error determinations.

SUMMARY OF THE INVENTION

Accordingly, the object of this invention is to provide a bonding point polarity determining apparatus which automatically determines the polarities of bonding points.

The above object of the present invention is accomplished by a unique structure which comprises:

- an applied voltage output circuit which outputs positive and negative voltage;
- a switching circuit which, after a wire passing through a bonding tool is connected to a first bonding point, or when a probe contacts the first bonding point, applies voltage supplied from the applied voltage output circuit to the wire or the probe;
- a D/A converter which outputs a standard positive and negative voltage;
- a polarity determining comparator which determines the polarity of the first bonding point by comparing a voltage detected on the wire or probe when voltage is applied to the wire or probe with the standard voltage; and
- a memory which stores results of the polarity determination for each bonding point.

With the structure described above, after the wire is connected to the first bonding point, or when the probe is brought into contact with the first bonding point, positive and negative voltage is applied to the wire or the probe.

If the polarity of the first bonding point is forward-sending (positive polarity), the detected voltage will be low in positive voltage and high in negative voltage. If the polarity of the first bonding point is backward-sending (negative polarity), the detected voltage will be, contrary to the above, high in positive voltage and low in negative voltage.

If a portion corresponding to the first bonding point is non-conductive material (or polarity with no detection required), the detected voltage will be high in both positive and negative voltages. If the first bonding point has any resistance (no polarity), the detected voltage will be low in both positive and negative voltages.

The thus obtained detected voltages are compared with the standard voltage, and the polarity of the first bonding point is determined, and then the result of these determinations are stored in the memory.

Once the polarity of each first bonding point is determined in this way, a connection fault detector switch is switched, at the time of wire bonding, based on the polarity data stored in the memory, so that positive or negative voltage is applied to the wire, thus detecting wire connection faults.

BRIEF DESCRIPTION OF THE DRAWINGS

FIGS. 2(a) through 2(j) show the timing of voltage detection, wherein FIG. 2(a) is a locus diagram of a vertical movement of the bonding tool, 2(b) is a diagram showing ultrasonic vibration, 2(c) is a diagram showing the timing of detection, 2(d) is a diagram showing the gate signal, 2(e) is a diagram showing the standard threshold voltage, 2(f) is a diagram showing the applied voltage, and 2(g), 2(h), 2(i) and 2(j) are diagrams showing the status of detected voltage; and FIGS. 3(a) through 3(d) illustrate bonding point polarities, wherein FIG. 3(a) shows positive polarity, 3(b) shows negative polarity, 3(c) shows polarity with no detection required, and 3(d) shows no polarity.

DETAILED DESCRIPTION OF THE INVENTION

An embodiment of the present invention is described below with reference to the accompanying drawings.

Figure 1:
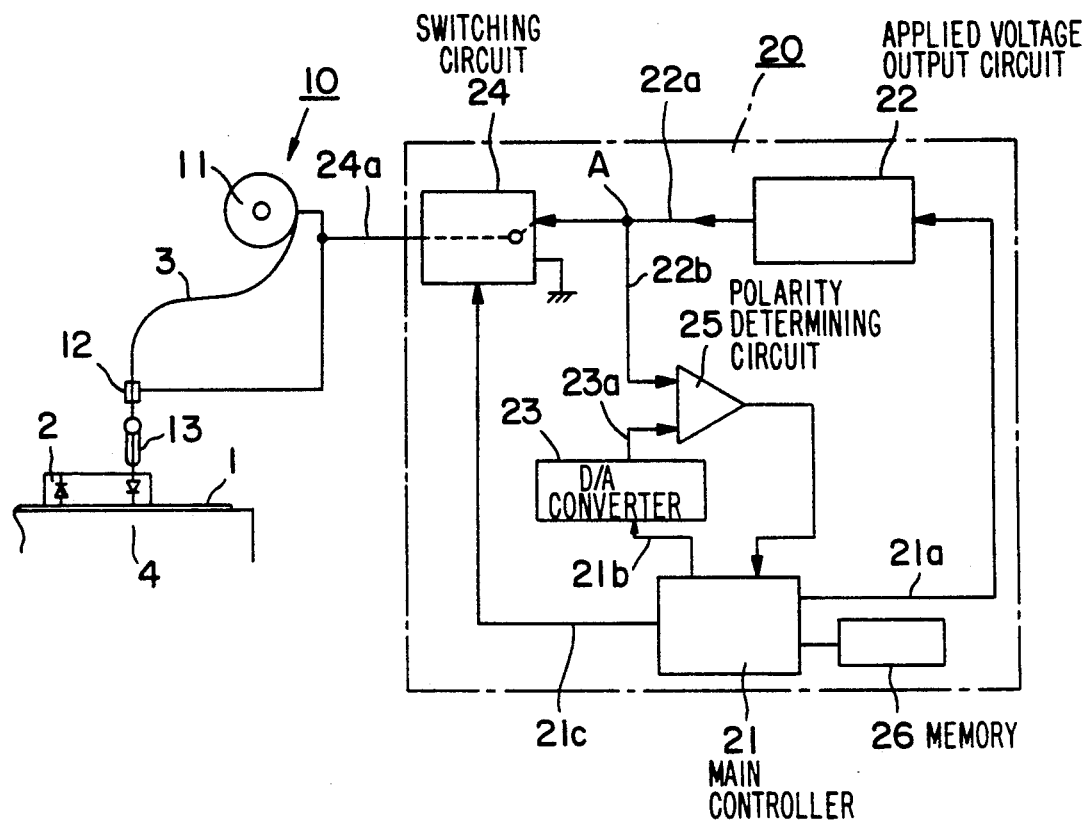
FIG. 1 is a block diagram showing the first embodiment of the present invention.

As shown in FIG. 1, a lead frame 1 to which a chip 2 is bonded is placed at a predetermined position on a bonding table 4. A wire bonding device 10 of known structure has a bonding wire 3 which is wound around wire spool 11. The wire 3 passes through a bonding tool 13 via clamp 12.

Reference numeral 20 represents a bonding point polarity determining apparatus, and it applies positive or negative voltage to the wire 3. Output lines 21a, 21b and 21c of the main controller 21 are connected to applied voltage output circuit 22, D/A converter 23 and switching circuit 24, respectively.

Voltage output circuit 22 outputs voltage to be applied to the wire (or probe which is described later) by switching between positive and negative voltages according to the command from the main controller 21. The D/A converter 23 converts standard digital signals outputted from main controller 21 to a voltage level and outputs a standard threshold voltage. The switching circuit 24 switches between (i) connecting the output line 24a of the switching circuit 24 to the output line 22a of the applied voltage output circuit 22, and (ii) connecting it to the ground, in accordance with the command from the main controller 21. When detection is not performed, the switching circuit 24 is kept grounded.

The output line 24a of the switching circuit 24 is connected to the end of the wire 3 which is wound around wire spool 11 and to the clamp 12. To the output line 22a is connected a detecting line 22b, and this detecting line 22b and the output line 23a of the D/A converter 23 are connected to the input port of polarity determining comparator 25. The polarity determining comparator 25 compares (i) the voltage which is detected when a voltage is applied to the wire 3 from the applied voltage output circuit 22 through the switching circuit 24 to (ii) the standard threshold voltage supplied by the main controller 21 through D/A converter 23. The result of such a comparison is transmitted to the main controller 21. The polarity thus detected is sent to and stored in the memory 26 for each bonding point for which detection has occurred.

The operation of the embodiment is described below. FIGS. 2(a) through 2(j) illustrate the timing of the determination of bonding point polarity.

When a ball is formed at the end of wire 3 that passes through bonding tool 13 and the bonding tool 13 is lowered to come into contact with the first bonding point, ultrasonic vibration represented by numeral 40 is applied to the bonding tool 13, and the ball is connected to the first bonding point.

After this connection of the ball, the switching circuit 24 is activated via detection timing signal 42 sent from the main controller 21 so that the output lines 22a and 24a are connected, and gate signal 43 is outputted from the main controller 21 to the applied voltage output circuit 22. In addition, a standard digital signal is inputted to D/A converter 23 and detection of the polarity of the first bonding point is performed. This polarity detection will be detailed later.

When polarity detection is completed, the bonding tool 13 is raised as referred to by numeral 31 and then lowered as referred to by numeral 32, and also moved in an X-Y direction so that the bonding tool 13 comes into contact with the second bonding point of the lead frame 1.

Then, ultrasonic vibration referred to by numeral 41 is applied to the bonding tool 13, and the wire 3 is connected to the second bonding point. After that, the bonding tool 13 and clamp 12 are lifted, the clamp 12 is closed, and the wire 3 is cut at the root portion above the second bonding point.

In this way, the bonding wire 3 is connected to the first and second bonding points, and also the polarity of the first bonding point is detected. By performing these series of operations automatically for each first bonding point, the polarity of each first bonding point is detected automatically.

Next, the method of detecting the polarity of the first bonding point is described.

As discussed above, when the gate signal 43 is outputted to the applied voltage output circuit 22 from the main controller 21, positive voltage 45a and negative voltage 45b, i.e., total voltage 45 as shown in FIG. 2(f), are orderly applied to the wire 3 through the switching circuit 24.

Figures 3A, 3B, 3C, 3D:
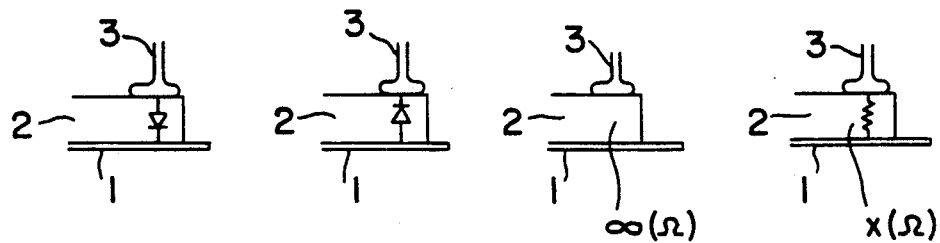

If the polarity of the first bonding point is positive, as shown in FIG. 3(a), the voltage detected at point A on the output line 22a is low in positive voltage as represented by numeral 50 as shown in FIG. 2(g).

If the polarity of the first bonding point is negative, as shown in FIG. 3(b), the voltage detected at point A on the output line 22a is low in negative voltage as represented by numeral 51 as shown in FIG. 2(h).

If the polarity of the first bonding point is a polarity that requires no detection, as shown in FIG. 3(c), the voltage detected at point A on the output line 22a is high in positive voltage as represented by numeral 52 and also high in negative voltage as represented by numeral 53 as shown in FIG. 2(i).

If the first bonding point has no polarity, as shown in FIG. 3(d), the voltage detected at point A on the output line 22a is low in positive voltage as represented by numeral 50 and also low in negative voltage as represented by numeral 51 as shown in FIG. 2(j).

The voltage thus detected at point A is inputted in the polarity determining comparator 25. Moreover, in the D/A converter 23, the digital signal from the main controller 21 is converted into a standard threshold voltage 44 as shown in FIG. 2(e), and the standard threshold voltage 44 is inputted in the polarity determining comparator 25. The voltage detected at point A and the standard threshold voltage 44 are compared by the polarity determining comparator 25.

As a result, the polarity of each bonding point is sent to the main controller 21 and stored in the memory 26 as a positive polarity when the detected voltage is as shown in FIG. 2(g), as a negative polarity when the detected voltage is as shown in FIG. 2(h), as a polarity with no detection required when it is as shown in FIG. 2(i), as no polarity when it is as shown in FIG. 2(j).

In the above embodiment, the polarity of the bonding point is detected by means of the bonding point polarity determining device 20 which is incorporated in the wire bonding machine 10. However, detection may be performed by not using wire bonding machine 10 but instead by using a detecting device in which a probe is connected to the switching circuit 24 so that the probe is moved by an X-Y direction (horizontal) driving device and a vertical driving device.

However, when the bonding point polarity determining device 20 is installed in the wire bonding machine 10, as in the case of this embodiment, a moving means of the wire bonding machine 10 itself can be used as the horizontal and vertical driving devices for the bonding tool 13. Also, a control section in the wire bonding machine 10 can be used as the main controller 21. Thus, installing the bonding point polarity determining device in a bonding machine is preferable from the standpoint of equipment costs.

As seen from the above description, according to the present invention, since the polarity of each bonding point is automatically determined, error determinations can be prevented and work time can be significantly reduced.

We claim:

1. A bonding point polarity determining means comprising:
    an applied voltage output circuit which outputs positive and negative voltages;
    a switching circuit which, after a bonding wire passing through a bonding tool of a wire bonding machine is connected to a first bonding point, or when a probe is in contact with said first bonding point, applies voltage from said applied voltage output circuit to said wire or probe;
    a D/A converter which outputs standard positive and negative voltages;
    a polarity determining comparator which determines a polarity of said first bonding point by comparing a voltage detected on said wire or probe when voltage is applied to said wire or probe with said standard voltage; and
    a memory which stores a result of said polarity determination for each bonding point.

2. A bonding point polarity determining means comprising:
    a main controller;
    an applied voltage output circuit connected to said main controller, outputting positive and negative voltages;
    a switching circuit connected to said applied voltage output circuit at one end and to a bonding wire at another end, said switching circuit, after said bonding wire is connected to a bonding point, applying voltage supplied by said applied voltage output circuit to said bonding wire;
    a D/A converter connected to said main controller, said converter outputting standard positive and negative voltages;
    a polarity determining comparator installed between said applied voltage output circuit and said switching circuit, said comparator determining a polarity of said bonding point by comparing a voltage applied to said bonding wire with said standard voltage supplied by said D/A converter; and
    a memory connected to said main controller, said memory storing a result of said polarity determination for said bonding point.

* * * * *